US011972920B2

(12) United States Patent
Dona et al.

(10) Patent No.: US 11,972,920 B2
(45) Date of Patent: Apr. 30, 2024

(54) VACUUM COMPATIBLE X-RAY SHIELD

(71) Applicant: FEI Company, Hillsboro, OR (US)

(72) Inventors: Pleun Dona, Veldhoven (NL); Casper Smit, Eindhoven (NL); Rients Jan de Groot, Heeze (NL)

(73) Assignee: FEI Company, Hillsboro, OR (US)

( * ) Notice: Subject to any disclaimer, the term of this patent is extended or adjusted under 35 U.S.C. 154(b) by 109 days.

(21) Appl. No.: 17/533,610

(22) Filed: Nov. 23, 2021

(65) Prior Publication Data
US 2023/0162942 A1    May 25, 2023

(51) Int. Cl.
H01J 37/16    (2006.01)
B33Y 80/00    (2015.01)
H01J 37/18    (2006.01)

(52) U.S. Cl.
CPC ............ *H01J 37/165* (2013.01); *H01J 37/18* (2013.01); *B33Y 80/00* (2014.12)

(58) Field of Classification Search
CPC   H01J 37/165; H01J 37/18; G03F 3/00; G03F 1/12; G03F 1/125
See application file for complete search history.

(56) References Cited

U.S. PATENT DOCUMENTS

| | | | |
|---|---|---|---|
| 2,981,786 A | 4/1961 | Beeney | |
| 3,239,424 A | 3/1966 | Lawson | |
| 3,322,993 A | 5/1967 | Vinopal | |
| 4,322,653 A | 3/1982 | Bader et al. | |
| 4,447,734 A | 5/1984 | Kusumegi et al. | |
| 4,750,805 A | 6/1988 | Vaderwall | |
| 5,038,370 A | 8/1991 | Harding et al. | |
| 6,749,337 B1 | 6/2004 | Artig et al. | |
| 7,773,726 B2 | 8/2010 | Inazuru | |
| 7,949,099 B2 | 5/2011 | Klinkowstein et al. | |
| 10,049,849 B2 | 8/2018 | Kuth et al. | |
| 10,748,740 B2 * | 8/2020 | De Groot | G21F 1/085 |
| 2003/0116722 A1 | 6/2003 | Tobias | |
| 2012/0170716 A1 | 7/2012 | Chen et al. | |
| 2014/0270091 A1 | 9/2014 | Nemeth et al. | |
| 2016/0233050 A1 | 8/2016 | Kasuya et al. | |
| 2019/0148102 A1 | 5/2019 | Maltz | |

(Continued)

FOREIGN PATENT DOCUMENTS

| | | | | |
|---|---|---|---|---|
| CN | 203150150 U | * | 8/2013 | |
| CN | 103608889 A | * | 2/2014 | A61L 2/087 |
| EP | 0 535 870 A1 | | 4/1993 | |

(Continued)

OTHER PUBLICATIONS

Partial European Search Report dated Mar. 28, 2023, from European Patent Application 22208535.9, 9 pages.

(Continued)

*Primary Examiner* — David E Smith
(74) *Attorney, Agent, or Firm* — Klarquist Sparkman, LLP

(57) ABSTRACT

Methods and apparatus are disclosed for providing an X-ray shield within an ultra-high vacuum enclosure. A shell is fabricated, leak-tested, filled with an X-ray shielding material, and sealed. An elongated twisted X-ray shield can be deployed within a pump-out channel of an electron microscope or similar equipment. The shield can incorporate lead within a stainless steel shell, with optional low-Z cladding outside the shell. Further variations are disclosed.

25 Claims, 13 Drawing Sheets

(56) References Cited

U.S. PATENT DOCUMENTS

2020/0066479 A1\* 2/2020 De Groot ................. G21F 3/00

FOREIGN PATENT DOCUMENTS

| EP | 3438005 A1 | | 2/2019 |
|----|------------|---|--------|
| EP | 3438005 A1 | | 2/2022 |
| JP | S 6132947 A | | 2/1986 |
| JP | H05-62898 U | \* | 8/1993 |
| JP | H05-62898 U | | 8/1993 |
| JP | H05- 62898 U | | 8/1993 |
| JP | 2009068973 A | \* | 4/2009 |
| JP | 2009-142896 A | | 7/2009 |
| JP | 2015-076321 A | | 4/2015 |
| JP | 2020-073867 A | | 5/2020 |

OTHER PUBLICATIONS

European Search Report issued in Application No. EP 19 19 2034 dated Jan. 16, 2020, pp. 1-2.
Extended European Search Report dated Jun. 28, 2023, from European Patent Application No. 22208535.9-1212, 9 pages.
Notice of Reasons for Refusal dated Oct. 3, 2023, from Japanese Patent Application No. 2022-186257, 5 pages.

\* cited by examiner

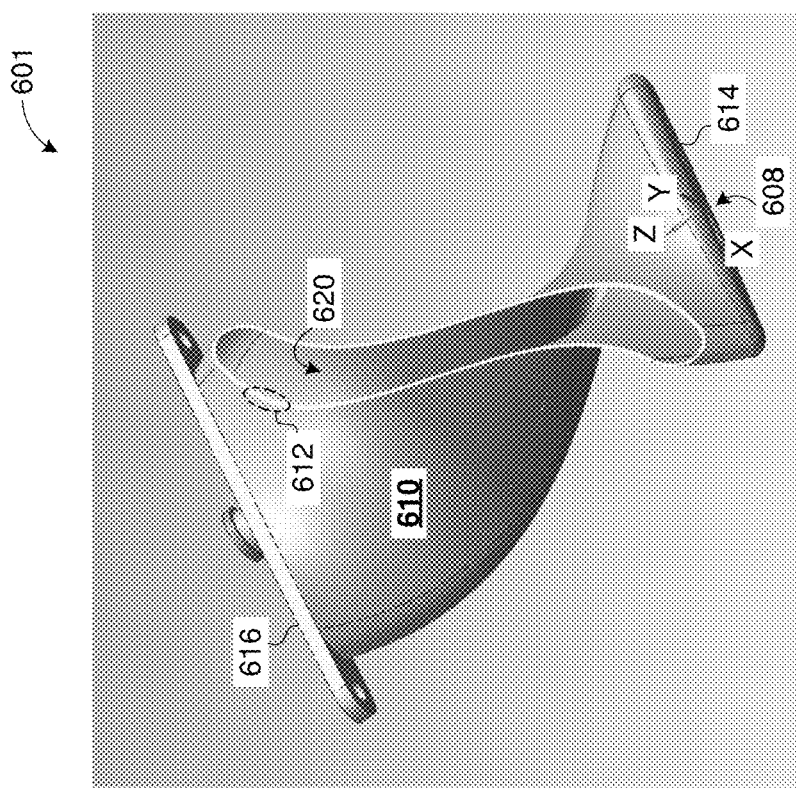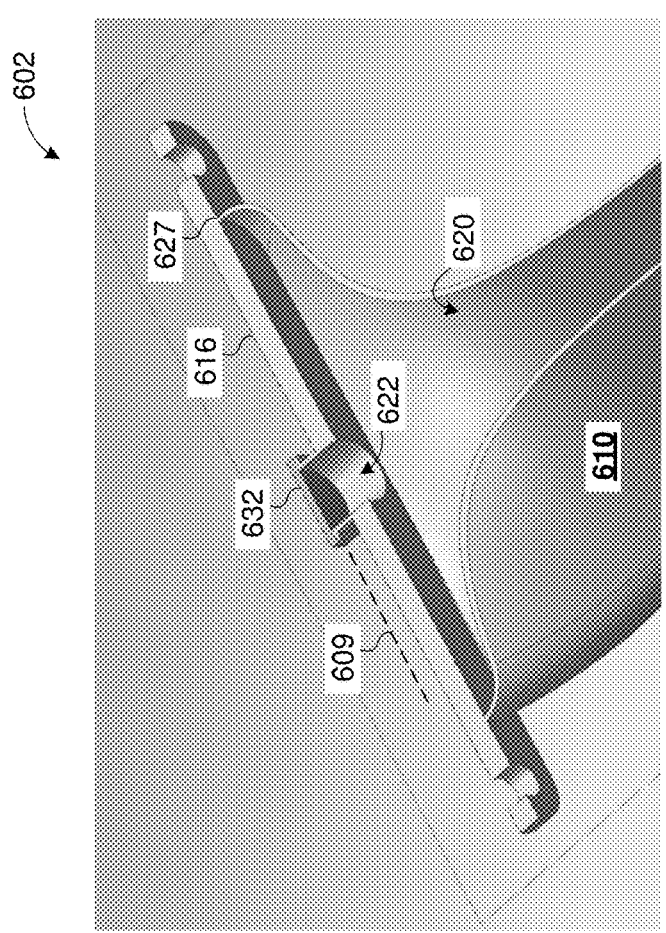
*FIG. 6A*
*FIG. 6B*

900

910 PLACE AN INVERSE VACUUM BOTTLE CONTAINING AN X-RAY SHIELDING MATERIAL INSIDE A VACUUM ENCLOSURE OF AN ELECTRON MICROSCOPE

920 PUMP THE VACUUM VESSEL TO A PRESSURE BELOW $10^{-9}$ MBAR

*FIG. 9*

VACUUM COMPATIBLE X-RAY SHIELD

FIELD

The disclosure pertains to X-ray shields.

BACKGROUND

X-ray shields are required in a wide range of applications including electron microscopes and other systems where high energy particle beams are incident on matter, resulting in X-ray generation. For reasons of geometry, an X-ray shield positioned close to an X-ray generation site requires less shielding material than a shield placed farther away. However, systems generating X-rays often operate under ultra-high vacuum (UHV), while some common shielding materials are incompatible with an ultra-high vacuum. Accordingly, there remains a need for improved technologies enabling compact X-ray shields to be utilized within an ultra-high vacuum.

SUMMARY

In brief, examples of the disclosed technologies provide X-ray shielding material inside a stand-alone vacuum-tight enclosure which can be deployed within an ultra-high vacuum environment.

In a first aspect, the disclosed technologies can be implemented as a method of manufacturing an X-ray shield. A shell defining a chamber, and having one or more ports, is fabricated. The shell is tested to verify that the shell is free of leaks. The tested shell is filled with an X-ray shielding material. The one or more ports of the filled shell are sealed.

In some examples, the shell can be fabricated by an additive manufacturing process, which can incorporate one or more of: direct metal laser sintering (DMLS), selective laser melting (SLM), electron beam melting (EBM), or binder jetting (BJ). In varying examples, the shell can be rigid; can incorporate stainless steel; and/or can have a median wall thickness in a range 0.1 to 1.0 mm. The rigid shell can incorporate a material having a first average atomic number Z1, and the method can include cladding the rigid shell with another material having an average atomic number Z2 less than Z1.

In additional examples, the X-ray shielding material can incorporate a metal and the filling operation can include introducing the metal in a molten state into the chamber. The X-ray shielding material can incorporate a resin loaded with metal particles. The one or more ports can include a first port, used to introduce the X-ray shielding material into the chamber during the filling operation, and a second port used to release displaced fluid from the chamber during the filling operation.

In further examples, the sealing can include welding a respective cap onto each of the one or more ports. For a duration encompassing the testing, the shell can be temporarily isolated from an environment surrounding the shell. The testing can have a leak rate threshold less than or equal to 10-7 mbar·l/s.

In further examples, the disclosed technologies can be implemented as a method of reducing X-ray emission from an electron microscope housed in a vacuum enclosure. An X-ray shield can be manufactured by any of the above methods or variations. The X-ray shield can be secured within an interior volume of the vacuum enclosure. The X-ray shield can be secured within a pump coupler of the electron microscope, and can be oriented so as to block at least 80% of X-rays emitted, parallel to a longitudinal axis of the pump coupler, through an intake aperture of the pump coupler.

In a second aspect, the disclosed technologies can be implemented as an apparatus having a vacuum enclosure and an X-ray shield positioned within the vacuum enclosure. The X-ray shield includes an inverse vacuum bottle containing an X-ray shielding material.

In some examples, the apparatus can be an electron microscope having a column axis and can further include a pump coupler. The X-ray shield can be positioned within the pump coupler and oriented so as to block at least 80% of X-rays that are emitted from an X-ray generation site within the vacuum enclosure, through an intake aperture of the pump coupler. A vacuum conductance of the pump coupler is reduced due to the X-ray shield, compared to without the X-ray shield, by not more than 20%.

The inverse vacuum bottle can incorporate stainless steel. The stainless steel can be clad with a material having an average atomic number less than or equal to 14. The X-ray shield can be formed to include a twisted elongate member. The X-ray shielding material can incorporate at least 50% by weight of lead. A pressure within the vacuum vessel can be held below 10-9 mbar.

In another aspect, the disclosed technologies can be implemented as a method in which an inverse vacuum bottle containing an X-ray shielding material is placed inside a vacuum enclosure of an electron microscope, and the vacuum enclosure is pumped to a pressure below 10-9 mbar.

In some examples, the vacuum vessel can incorporate a pump coupler, and the placing can include securing the inverse vacuum bottle within the pump coupler.

The foregoing and other objects, features, and advantages of the invention will become more apparent from the following detailed description, which proceeds with reference to the accompanying figures.

BRIEF DESCRIPTION OF THE DRAWINGS

FIGS. 6A-6D are views of a first example X-ray shield according to the disclosed technologies.

FIG. 9 is a flowchart of a third example method according to the disclosed technologies.

DETAILED DESCRIPTION

Introduction

Figure 1A:
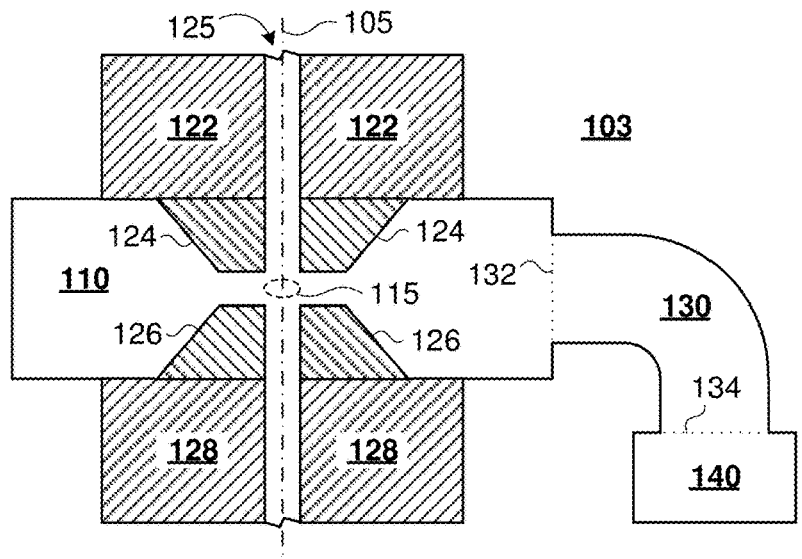
FIGS. 1A-1B are section views of a portion of an electron microscope suitable for deployment of disclosed technologies.

X-ray shielding is often used around X-ray generating equipment for reasons of personnel safety. X-rays can be generated within electron microscopes (e.g. TEM and SEM), focused ion beam machines, other analytic equipment (e.g., performing electron scattering, X-ray diffraction, or similar techniques), or other equipment where high energy particle beams impinge on materials.

In an electron microscope, X-ray generation due to stray electrons striking an aperture plate or wall of the microscope column can be controlled or minimized through careful design. However, incidence of the electron beam on a sample is a fundamental aspect of electron microscope operation and cannot be eliminated. Moreover, electron microscopes are commonly used with beam voltages in excess of 60 keV, and the resultant X-ray production can be significant. Similar considerations apply to other particle beam equipment.

Accordingly, the center of a sample chamber, where a sample is normally placed for imaging by an electron microscope, represents a significant X-ray generation site. The sample chamber of an electron microscope can be congested, particularly in the case of a transmission electron microscope (TEM). In some directions, a location outside the sample chamber may be as close as it is practical to place an X-ray shield, and such a shield can be deployed without consideration for vacuum compatibility. However, the sample chamber (and the entire electron beam channel) can be maintained under ultra-high vacuum, for which purpose a pipe section dubbed a coupler can connect the sample chamber to a vacuum pump. To maximize vacuum conductance, the coupler can have a wide cross-section and can be generally free of obstructions to gas flow. Thus, the coupler can also present a clear egress path for X-rays. Because of the dimensions of the vacuum pump and the coupler, an X-ray shield provided external to the coupler can be bulky and heavy, and it can be desirable to provide an X-ray shield inside the coupler or between the coupler and the X-ray generation site at the center of the sample chamber.

Such internal X-ray shield positioning could be straightforward in the case of a stainless steel shield (subject to considerations of degraded vacuum conductance). However, stainless steel has a relatively low stopping power for X-rays. Under typical electron beam conditions and typical requirements for X-ray attenuation by a shield, the thickness of stainless steel required for shielding could be about 20 cm. Aluminum, with lower atomic number, could require even more—about 40 cm thickness.

Lead, on the other hand, has superior stopping power, and can provide sufficient shielding with merely 1.5 cm thickness. But lead is prone to outgassing, and exposed lead surfaces can be undesirable within a UHV system. Still further, a vacuum-compatible coating (generally, a metal coating), applied to a lead structure, can be susceptible to defects. That is, it can be difficult to achieve a defect-free sealed coating over the lead. Still further, it can be difficult to test whether the coated structure is in fact leak-free.

The disclosed technologies solve these problems by leak-testing a hollow shell and then filling the with an X-ray shielding material. The resulting X-ray shield can be deployed anywhere suitable within an ultra-high vacuum system. Only the shell material (which can be stainless steel or a low-Z vacuum compatible material such as aluminum) is exposed to the vacuum, and leak-tightness of the shield can be assured. Thus, the respective advantages of stainless steel and lead can be advantageously combined and a compact X-ray shield can be deployed within a pump coupler or at any other available location within a UHV enclosure.

For reasons of maintaining vacuum conductance through the pump coupler, complex shapes such as elongated twist structures can be used. Shells of such shapes can be manufactured conveniently using additive machining, although this is not a requirement. For example, sections of a shell can be manufactured by forming sheet metal, extrusion, or casting, in addition or alternatively to additive manufacturing, and welding the sections together.

The following section provides a brief description of a representative TEM which can benefit from the disclosed technologies.

Example Electron Microscope

Figure 1B:
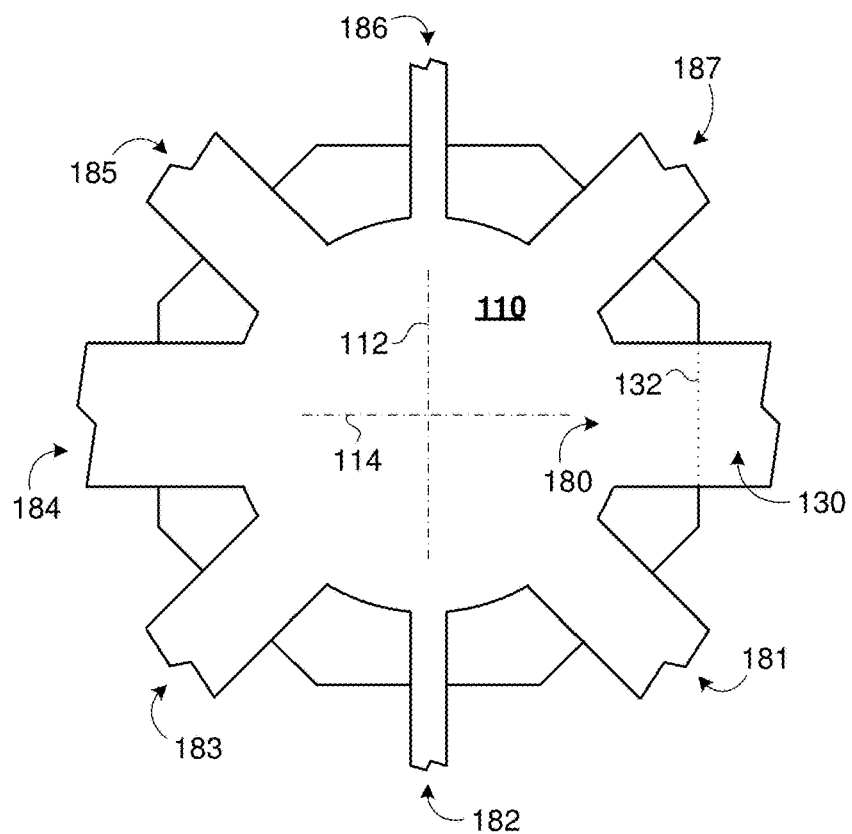

FIGS. 1A-1B are section views 101-102 of a portion of an electron microscope, and provide context for examples of the disclosed technologies described herein. For purpose of illustration FIGS. 1A-1B depict a common TEM configuration, however the disclosed technologies can be applied similarly to other equipment.

FIG. 1A is a vertical section through column axis 105. Sample chamber 110 can be situated between condensor electron optics 122 and objective electron optics 128. Optics 122, 128 and sample chamber 110 define a portion of an electron column of the electron microscope, within which an electron beam can be guided through channel 125.

Pole pieces 124, 126 shape magnetic fields between them. In normal operation a sample can be held midway between pole pieces 124, 126 along column axis 105. Incidence of the electron beam on the sample can lead to generation of X-rays. Thus, oval 115 denotes an X-ray generation site.

The interior of the electron column, including sample chamber 110 can be maintained at ultra-high vacuum during operation. Accordingly, vacuum pump 140 can be joined to sample chamber 110 by pump coupler 130 having intake aperture 132 and outlet aperture 134. A vacuum enclosure of the electron microscope comprises all or parts of the walls of sample chamber 110, coupler 130, a portion of pump 140, and additional components above or below sample chamber 110 along electron channel 125. An interior space of the vacuum enclosure, including sample chamber 110 and X-ray generation site 115, can be under ultra-high vacuum, while exterior environment 103 can be an indoor room environment at one atmosphere air pressure.

FIG. 1B is a horizontal section through a midplane of sample chamber 110, showing a common octagon configuration having symmetry axes 112, 114 and eight ports. In some examples, two opposed ports 181, 185 can be used for a sample loader and a sample manipulator, while other ports 182-184, 186-187 can be variously used for a cold finger, instrumentation access, or auxiliary tools; or can be unused. In normal operation, each of ports 181-187 can provide a vacuum-tight connection to associated equipment, or can simply be sealed closed. Channel 180 of sample chamber 110 can be coupled to pump coupler 130 at intake aperture 132. For clarity of illustration, flanges, gaskets, or other coupling details are omitted from FIGS. 1A-1B. The intersection of symmetry axes 112, 114 can lie on column axis 105.

Terminology

The term "additive manufacturing" (sometimes, "3-D printing") refers to processes for fabricating objects using layer-by-layer material deposition, with the object shape defined by computer-directed deposition of the material rather than by a pre-formed mold. That is, additive manufacturing fabricates shape without use of a mold, although a substrate can be used as a base upon which additional material layers are deposited.

The term "atomic number" (Z) refers to the number of protons in one atomic nucleus of an elemental material. For a composition of multiple elements (e.g., an alloy, a compound, a mixture, or a composite of one material interspersed with or within another material), an "average atomic number" Zavg can be defined as $$Zavg = \left[\sum_i f_i Z_i^k\right]^{1/k}$$

where the subscript i denotes a respective element in the composition having atomic number Zi, and fi is the fraction of protons in the composition belonging to atoms of element i. That is, $\Sigma_i f_i = 1$. k and 1/k are positive exponents; k=1 denotes a simple average atomic number, while k=2.94 denotes a Khan average atomic number, sometimes dubbed "effective atomic number". For an elemental material, the average atomic number is simply the atomic number of that element. While atomic number is an integer, average atomic number need not be an integer. A low-Z material has average atomic number less than equal to 14. In some examples, aluminum (Z=13) can be used as a low-Z cladding over the shell of an X-ray shield. A high-Z material has average atomic number greater than or equal to 50.

In the context of X-rays or X-ray shielding, the term "block" refers to an X-ray interacting with an X-ray shield resulting in absorption or inelastic scattering. Inelastic scattering is a process whereby one or more photons are generated, each with lower energy than the incident X-ray, and the original X-ray is extinguished. Non-interacting incident X-rays can be said to "pass" through the shield. Passing can include elastic scattering. The term block can be contingent on the normal operation of an apparatus. To illustrate, a given X-ray shield could block 99% of X-rays generated by a 10 keV electron beam (while passing the other 1%), 90% of X-rays generated by a 100 keV beam (while passing the other 10%), or 50% of X-rays generated by a 1 MeV beam (while passing the other 50%).

The term "bottle" refers to a sealable container with at least one port coupling the interior of the container to its exterior. A bottle remains a bottle when the at least one port is closed. A "vacuum bottle" is a bottle which can be evacuated (e.g., through the port) to hold a vacuum in the interior of the bottle, with discrete objects optionally situated in the vacuum. An "inverse vacuum bottle" is a bottle which can hold material sealed from vacuum exterior to the bottle. A bottle can have any of a wide range of shapes, and is not limited to shapes that are cylindrical or shapes that have a narrow neck leading to a port. Some bottles of interest herein can have twisted or helical shapes, with one, two, or more ports.

The term "chamber" refers to a space or volume inside an enclosure. The presence of one or more ports does not preclude an enclosure from defining a chamber. A "sample chamber" is a chamber, often within an electron microscope or other analytic equipment, in which a sample can be placed for analysis under normal operation.

An "electron microscope" is a type of analytic equipment in which a sample is illuminated by an electron beam, and resulting particles or electromagnetic radiation are used to form an image. A scanning electron microscope (SEM) images a sample surface based on reflected, secondary, or backscattered particles or radiation from the sample surface on which the electron beam is incident. Because beam interactions detected by a SEM occur at or near this surface, a SEM can operate on samples of arbitrary thickness. In contrast, a transmission electron microscope (TEM) images a sample surface based on transmitted electrons (including scattered electrons). A TEM operates on samples of about 10-150 nm thickness, which can be mounted on a grid for mechanical support and thermal conductivity; in turn the grid can be held in a sample holder. A TEM can provide magnifications up to and exceeding 50 million, while SEM magnifications are usually limited to about 2 million. In this disclosure, scanning transmission electron microscopes (STEM), which perform imaging of transmitted electrons, are considered to be TEMs. The electron beam in an electron microscope can be generated in an electron gun, and accelerated, focused, or steered through a series of stages toward a sample chamber. Commonly, the electron gun, intermediate stages, the sample chamber, and downstream imaging stages can be arranged as a columnar structure dubbed an "electron microscope column", or simply "column". A longitudinal axis of the column is dubbed a "column axis."

The term "enclosure" refers to a structure defining an interior space (e.g., a chamber). While some enclosures described herein are sealed, this is not a requirement, and other enclosures can have one or more ports allowing matter to freely move between interior and exterior spaces. Particularly, some described enclosures can have ports that are initially open, but then are temporarily closed (e.g., for leak testing) or permanently closed (e.g., prior to putting the enclosure in service).

The term "filling," applied to a chamber (or shell), is understood to mean that at least 50% by volume of the chamber (or interior space of the shell) is occupied by a filling material, such as X-ray shielding material.

The term "fluid" refers to matter in a liquid or gas phase that can assume the shape of a surrounding enclosure. A fluid can be homogeneous or inhomogeneous.

The term "isolated," in context of enclosures, refers to two spaces lacking a clear path connecting the two spaces. An enclosure with no open ports can serve to isolate its interior volume from an exterior space. The presence of leaks in an enclosure does not preclude the spaces from being isolated.

The term "leak," as a noun, refers to an unintended path through a wall of an enclosure. As a verb, the term refers to an act of passing through a leak. A path through a wall can be considered to be a leak if its leak rate is between $10^{-3}$ mbar·l/s and a predetermined leak rate threshold (such as $10^{-12}$ mbar·l/s).

The term "leak rate" refers to a rate at which a material passes through a surface under a given pressure difference, and is commonly measured in units similar to mbar·liter/ second (shortened to mbar·l/s). Air can pass through a 10 μm diameter hole in a thin wall, across a one atmosphere pressure difference, at about $10^{-2}$ mbar·l/s. Leak rates of interest herein for ultra-high vacuum systems can be in a range $10^{-3}$ to $10^{-12}$ mbar·l/s, for He gas at 25° C. with 1000 mbar (one atmosphere) pressure difference.

The term "port" refers to a macroscopic opening in an enclosure. Commonly, a port can have a transverse spatial extent in a range 0.1 mm to 10 cm, sometimes 1 mm to 1 cm, but this is not a requirement. A port can be circular, but this is not a requirement, and ports having square, oval, elongated slot shapes, or other shapes can also be used. A "pumping port" is a port of a vacuum enclosure coupled to a vacuum pump.

The term "pump coupler" refers to a section of a vacuum enclosure coupling a main chamber of the vacuum enclosure to a vacuum pump. An interface region between the pumping port and a main chamber within a vacuum enclosure is termed an "intake aperture" of the pump coupler. The interface between the pump coupler and the vacuum pump can be a pumping port of the vacuum enclosure, sometimes termed an "outlet aperture" of the pump coupler. That is, fluid atoms or molecules extracted by a vacuum pump from the main chamber can pass from the main chamber through the intake aperture into the pump coupler, and thence through the outlet aperture into the vacuum pump.

The term "resin" refers to a viscous fluid. A resin is termed "loaded" when it serves as a medium holding suspended particles, such as particles of an X-ray shielding material. Some resins can be epoxy resins or other curable resins that cure to a rigid solid, but this is not a requirement. Other resins can retain their viscous fluid properties persistently.

The term "rigid" refers to an enclosure or other solid object having a determinate shape under normal usage. To illustrate, a glass bottle is rigid, while a common plastic bag is not. Minute shape deformations due to vibration, thermal expansion, changes in pressure differential between interior and exterior of an enclosure, or similar effects do not preclude an object being considered rigid.

The term "seal," as a verb, refers to an act of closing a port of an enclosure. The port can be closed, e.g., by welding a cap over the port. When all ports of an enclosure are sealed, the interior volume of the enclosure can be isolated from exterior space.

The term "shell" refers to a thin-walled enclosure. A shell can be rigid, but this is not a requirement. A bellows structure, whether made of stainless steel or another material, can be a flexible shell. Some shells of disclosed examples can have wall thicknesses in a range 30 μm to 3 mm, 100 μm to 1 mm, or about 0.3 mm. Wall thickness can vary between different portions of a shell. To illustrate, a shell of median thickness 0.3 mm can have a base section about 1 mm thick and a flange section about 3 mm thick.

The term "vacuum" refers to a condition of a chamber having a fluid pressure below $10^{-3}$ mbar. "Ultra-high vacuum" (UHV) refers to pressures below $10^{-9}$ mbar. 1 mbar is about $10^2$ Pa, $10^2$ N/m², or 0.75 torr.

The term "vacuum conductance" refers to a rate of mass flow between two planes in a vacuum, divided by the pressure difference between the planes. To illustrate, the two planes can be the intake and outlet apertures of a pump coupler. Under conditions of molecular flow, mass flow through the pump coupler can be proportional to the pressure difference between intake and outlet apertures. Generally, the presence of objects (e.g., an X-ray shield) within the pump coupler, bends, non-uniformities in cross-section of the pump coupler, or surface roughness can cause the vacuum conductance of a pump coupler to be lower than for a straight smooth-bore empty pump coupler of same or similar dimensions.

The term "vacuum enclosure" refers to a structure configured to isolate vacuum inside the enclosure from an environment not under vacuum. In some examples, the environment can be air, but this is not a requirement and other gas or liquid environments can be used. Alternatively, the environment outside a vacuum enclosure can be a higher pressure vacuum than inside the enclosure. A vacuum enclosure can be formed by a mix of one or more shells, other structures, ports, or gaskets, in any combination.

The term "vacuum pump" refers to an apparatus operable to extract fluid atoms or molecules from an interior space of a vacuum enclosure to which it is coupled. Vacuum pumps found in UHV systems can include turbomolecular pumps, cryopumps, ion pumps, or getters, which can be assisted by mechanical, diffusion, or other types of roughing pumps.

The term "welding" refers to a process for joining two solid objects, in which the material of both objects is temporarily heated or liquefied proximate to the joint. For metal objects, heating can be accompanied by liquefaction, e.g., with a welding torch, or heating can be performed without liquefaction, e.g., with acoustic energy in ultrasonic welding. For non-metals, e.g., polymers, heating or liquefaction can be performed with acoustic energy or with solvents. Some common welding processes, such as tungsten-inert-gas (TIG) or metal-inert-gas (MIG) welding, can use a filler material. Other welding processes, such as laser welding or ultrasonic welding, can omit a filler material.

The term "within" means wholly contained inside of. Thus, an innovative X-ray shield can be deployed within a vacuum enclosure, and can be removed from the vacuum enclosure. After removal of the X-ray shield, the vacuum enclosure can be re-sealed and evacuated, intact and in a same configuration with or without the X-ray shield.

The term "X-ray" refers to electromagnetic radiation having a wavelength in a range about 10 pm to 10 nm or photon energy in a range about 100 eV to 100 keV. X-rays are often generated through the interaction of a high-energy particle beam with stationary material, but this is not a requirement. X-rays can also be generated through interaction of higher energy photons (e.g., gamma rays or other X-rays) with matter, or through radioactive decay. In some disclosed examples, X-rays can arise within an electron microscope, for example at a site where an electron beam is incident upon a sample. X-rays can also be generated by incidence of a focused ion beam on a sample.

The term "X-ray generation site" refers to a location in an apparatus where, under normal operation of the apparatus, X-rays are expected to be generated. For example, a sample stage or a sample chamber within an electron microscope can be an X-ray generation site. A plate or block defining an aperture through which an electron beam passes can also be an X-ray generation site. Thus, the X-ray generation site is present within the apparatus when the apparatus is switched off or when no sample is present.

The term "X-ray shield" (or simply "shield") refers to a device incorporating an X-ray shielding material and configured to block some X-rays. The blocked X-rays can be generated during normal operation of an apparatus associated with the X-ray shield.

The term "X-ray shielding material" refers to a material having average atomic number at least 30, or in a range 30 to 100. Some X-ray shielding materials of interest in this disclosure include lead (atomic number Z=82), tungsten (Z=74), or tin (Z=50). Antimony (Z=51), tantalum (Z=73), bismuth (Z=83), or depleted uranium (Z=92) can also be used. Common structural materials such as stainless steel (Zavg=29) or aluminum (Z=13) are not considered X-ray shielding materials herein.

Example X-Ray Shield Deployments

Figure 2:
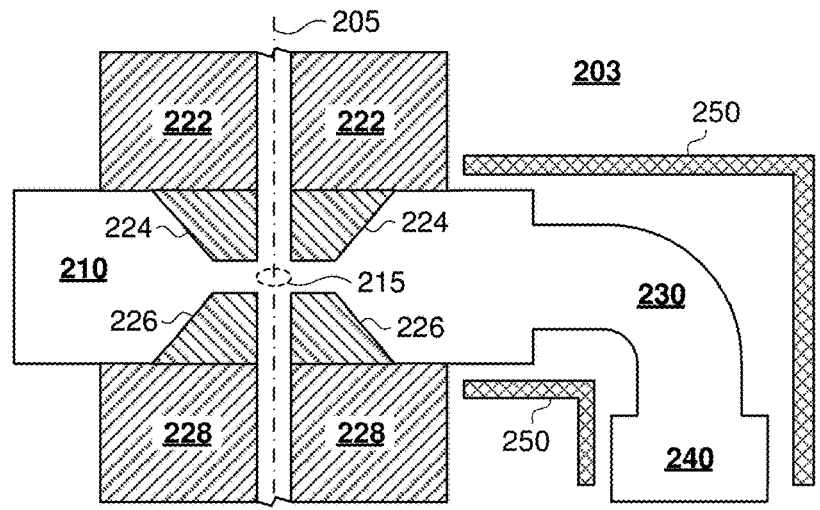
FIG. 2 is a section view of an apparatus with X-ray shielding conventionally deployed external to a vacuum enclosure.

FIG. 2 is a section view 200 illustrating X-ray shielding deployed external to a vacuum enclosure. FIG. 2 depicts a representative electron microscope generally similar to that of FIG. 1A. X-ray generation site 215 is situated along column axis 205 and within sample enclosure 210, the latter coupled to pump 240 via pump coupler 230, in a configuration similar to that described in context of FIGS. 1A-1B. The illustrated apparatus includes electron optics 222, 228 and pole pieces 224, 226, also similar to that of FIG. 1A.

In FIG. 2, X-ray shield 250 is provided outside (203) the vacuum enclosure in a conventional arrangement. Because shield 250 is not within the interior vacuum space, no provision for vacuum compatibility is required. However, shield 250 surrounds and is larger than pump coupler 230, and the mass of shield 250 can be considerable.

Figure 3:
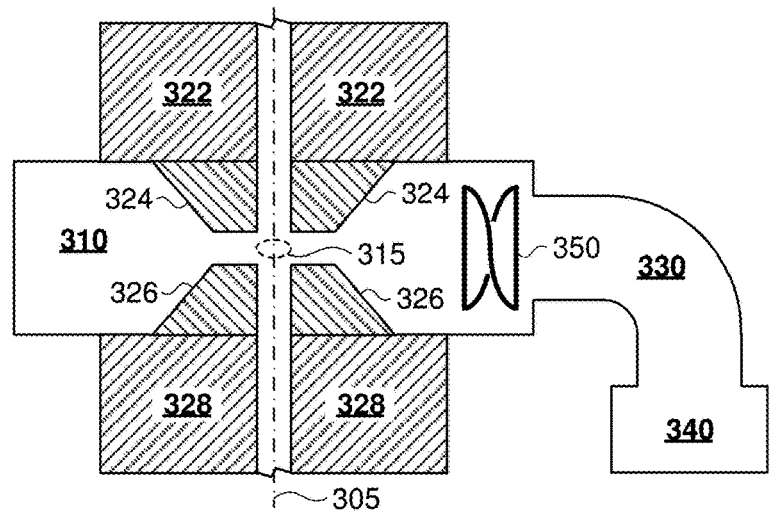
FIG. 3 is a section view of an apparatus with an X-ray shield according to a first example of the disclosed technologies, deployed inside a vacuum enclosure.

FIG. 3 is a section view 300 of an apparatus with an X-ray shield deployed inside a vacuum enclosure. Particularly, innovative X-ray shield 350 can be placed within the vacuum enclosure, e.g., within sample chamber 310 and in proximity to X-ray generation site 315. Other components in FIG. 3, including components 322, 324, 326, 328 along an electron column having axis 305, as well as pumping port components coupler 330 and pump 340, are generally similar to similarly numbered components described in context of FIG. 1A and are not described further.

Figure 4:
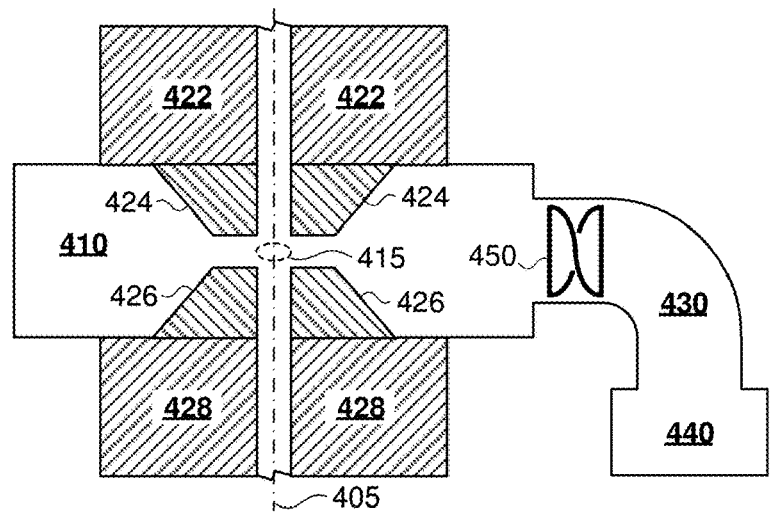
FIG. 4 is a section view of an apparatus with an X-ray shield according to a second example of the disclosed technologies, deployed inside a vacuum enclosure.

FIG. 4 is a section view 400 of an apparatus with another X-ray shield deployed inside a vacuum enclosure. Particularly, innovative X-ray shield 450 can be placed within the vacuum enclosure, e.g., within pump coupler 430. Other components in FIG. 4, including components 410, 422, 424, 426, 428 along an electron column having axis 405, as well as pump 440, are generally similar to similarly numbered components described in context of FIG. 1A and are not described further.

Numerous variations and extensions of the disclosed method can be implemented. In some examples, an X-ray shield can be placed partly within sample chamber 310 and partly within pump coupler 330, i.e., straddling intake aperture 332. In other examples, multiple X-ray shields can be deployed within a vacuum enclosure, variously disposed between sample chamber 310, pump coupler 330, or proximate to other ports (e.g. similar to 181-187 of FIG. 1B). In further examples, a combination of X-ray shields can be deployed inside a vacuum enclosure (similar to 350 or 450) and outside the vacuum enclosure (similar to 250). The shapes depicted for innovative X-ray shields 350, 450 are merely exemplary, and innovative X-ray shields can be fabricated in a wide range of shapes or sizes to suit geometric or functional constraints of a given application.

First Example Method

Figure 5:
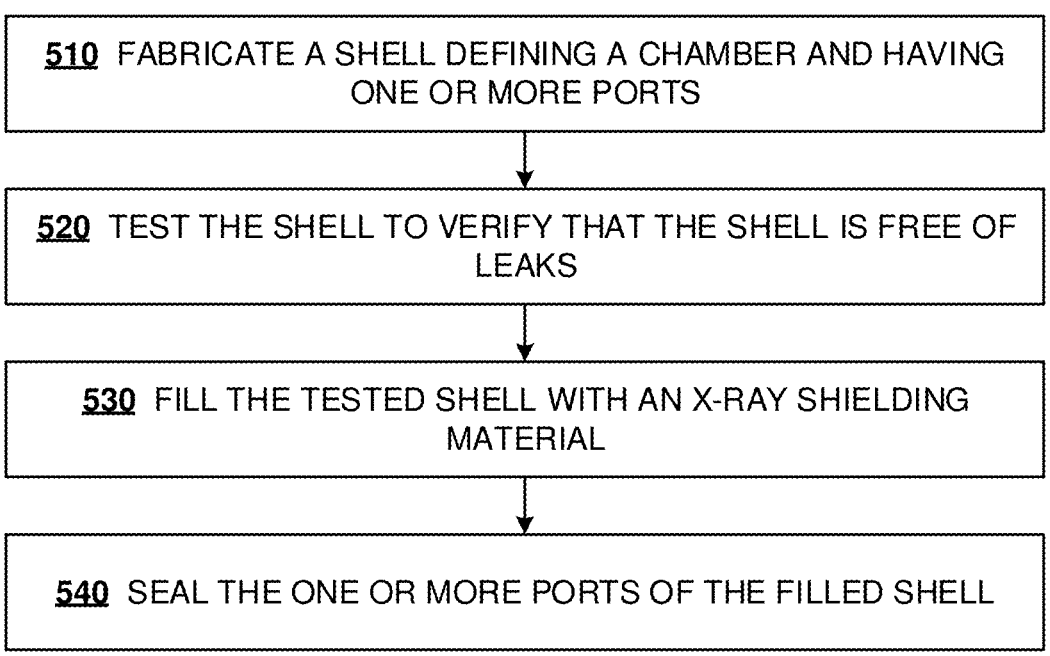
FIG. 5 is a flowchart of a first example method according to the disclosed technologies.

FIG. 5 is a flowchart 500 of a first example method for fabricating an X-ray shield. In this method, a shell is fabricated, leak-tested, filled, and sealed, to obtain an X-ray shield suitable for deployment within an ultra-high vacuum enclosure.

At process block 510, a shell can be fabricated. The shell can define a chamber and can have one or more ports. At block 520, the shell can be tested to verify that the shell is free of leaks. Then, at block 530, the tested shell can be filled with an X-ray shielding material and, at block 540, the port(s) of the shell can be sealed.

Numerous variations and extensions of the disclosed method can be implemented. Fabrication at block 510 can be performed by additive manufacturing, and can include one or more of direct metal laser sintering (DMLS), selective laser melting (SLM), electron beam melting (EBM), or binder jetting (BJ).

The shell can be rigid. The shell material can include stainless steel. The shell can have a median wall thickness of about 0.3 mm, or in a range 0.05 to 2.0 mm, or 0.1 to 1.0 mm.

Prior to leak testing, the chamber inside the shell can be temporarily isolated from the environment outside the shell. For example, one port can be sealed with a cap and another port can be coupled to a Helium leak detector. Temporary isolation can be maintained for the duration of leak testing 520 and can be undone thereafter so that the port(s) can be used for filling the shell at process block 530.

Leak testing 520 can be performed to a predetermined leak rate threshold, meaning that a measured leak rate above the threshold results in failing the test, while a measured leak rate below the threshold results in passing the test. The predetermined leak rate threshold can be an ultimate sensitivity of the Helium leak detector, or another leak rate value higher than the ultimate sensitivity. To illustrate, a leak detector can have a sensitivity of $10^{-9}$ mbar·l/s and the predetermined threshold can be $10^{-7}$ mbar·l/s. Then, a shell having a detected leak rate of $10^{-8}$ mbar·l/s can pass the leak test and can be deemed free of leaks. As another illustration, the predetermined threshold can be equal to the sensitivity of an instant leak detector, so that any detected leak causes a shell to fail the leak test, and an absence of any detectable leak is required to pass the leak test.

In some examples, a first port can be used during filling 530 to introduce an X-ray shielding material into the chamber, while a second port can be used to release pre-existing fluid (e.g., air) displaced from the chamber as the chamber is filled. In other examples, the second port can be connected to a pump to evacuate the chamber prior to filling, to avoid trapped air pockets and ensure a void-free X-ray shield. In further examples, more than one port can be used for either the filling function or the release function. Still further, filling 530 can be performed using a single port. The single port can be connected to two valves, one valve being opened for chamber evacuation by a pump, and the other valve being opened for filling from a supply reservoir. Alternatively, the single port can be used simultaneously for filling, through a feeding tube inserted into the port, and for release of displaced fluid, through a portion of the port not blocked by the feeding tube.

The X-ray shielding material can include at least 50% by weight of a high-Z metal, such as lead. Filling at block 530 can include introducing the metal into the chamber in a molten state. The X-ray shielding material can be in the form of metal powder suspended within a resin.

Sealing at block 540 can include welding a respective cap onto each of the one or more ports of the shell.

The shell can have an average atomic number Z1 and the method can be extended to cladding the shell with another material having average atomic number Z2<Z1.

Example Procedure for Reducing X-Ray Emission

In some examples, the disclosed technologies can be applied to reduce X-ray emission from an electron microscope or from other X-ray generating equipment. The electron microscope or other equipment can have an X-ray generation site situated within a vacuum enclosure. An X-ray shield can be manufactured by the methods of FIG. 5 or FIG. 7, as shown in the respective figure or using any of the variations or extensions described herein, in any combination. Then, the X-ray shield can be secured within an interior volume of the vacuum enclosure. In some examples, the X-ray shield can be positioned within a pump coupler, e.g., along a path between the X-ray generation site and a vacuum pump, and can be oriented to block greater than a first threshold fraction of X-rays emitted through an intake aperture of the pump coupler and parallel to a longitudinal axis of the X-ray shield. In varying examples, the first threshold fraction can be 50%, 80%, 90%, 95%, 98%, or 99%.

Example X-Ray Shield

FIGS. 6A-6D are views 601-604 of a first example X-ray shield according to the disclosed technologies. Views 601-602 are cutaway views of the X-ray shield. For clarity of illustration, X-ray shielding material has been omitted from views 601-602, but will be described below.

FIG. 6A shows a shell 610 having a curved twisted surface with wall 612 and defining a chamber 620. Also part of shell 610 are base 614 and mounting flange 616. In some examples, at least wall 612 can be fabricated using an additive manufacturing technique. In varying examples: one or both of base 614 and flange 616 can also be fabricated by additive manufacturing, e.g. in a same process operation as wall 612; one of base 614 and flange 616 can be provided as a base upon which wall 612 is additively manufactured; or one or both of base 614 and flange 616 can be fabricated separately from wall 612 and joined to wall 612 in a separate process operation. Accordingly, base 616, wall 612, and flange 614 can be formed of a same material or of different materials, in any combination. In some examples, base 616, wall 612, and flange 614 can all be stainless steel. In FIG. 6A, chamber 620 is shown hollow, to better illustrate the structure of the instant X-ray shield. As deployed for service, chamber 620 can be filled with an X-ray shielding material. XYZ coordinate axes 608 are also shown.

FIG. 6B is another view 602 through a midplane of flange 616, showing a structure of port 622 sealed (temporarily or permanently) by cap 632. Generally, cap 632 can be regarded as part of a completed X-ray shield but not as part of shell 610. In FIG. 6B, dashed line 609 indicates a farthest extent of shell 610 in the direction of cap 632 (the Z direction of coordinate axes 608 shown in FIG. 6A).

Figure 6D:
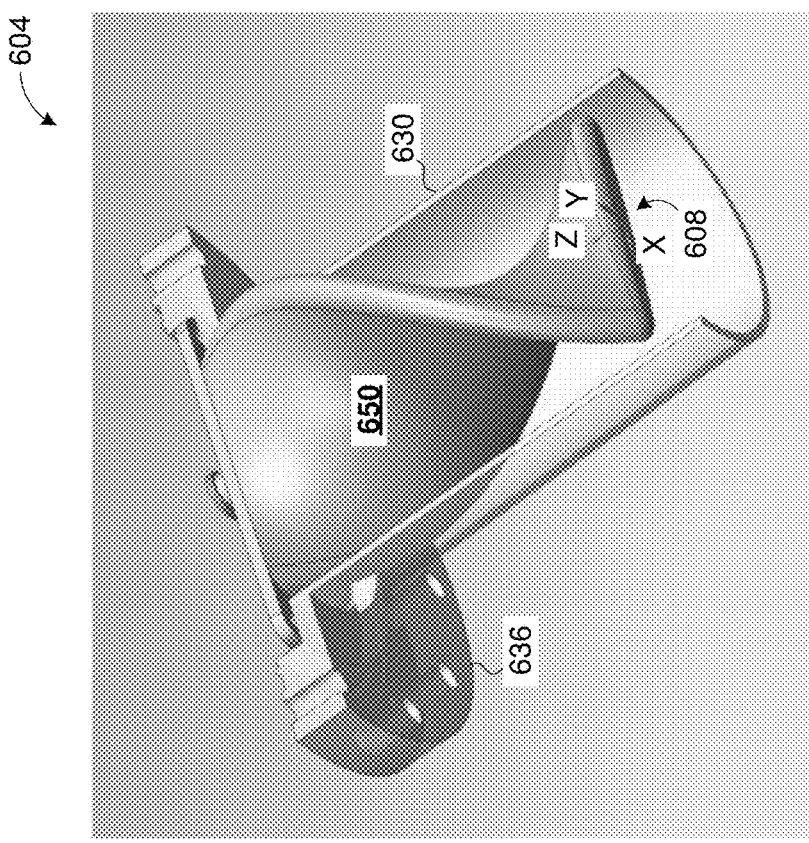
Figure 6C:
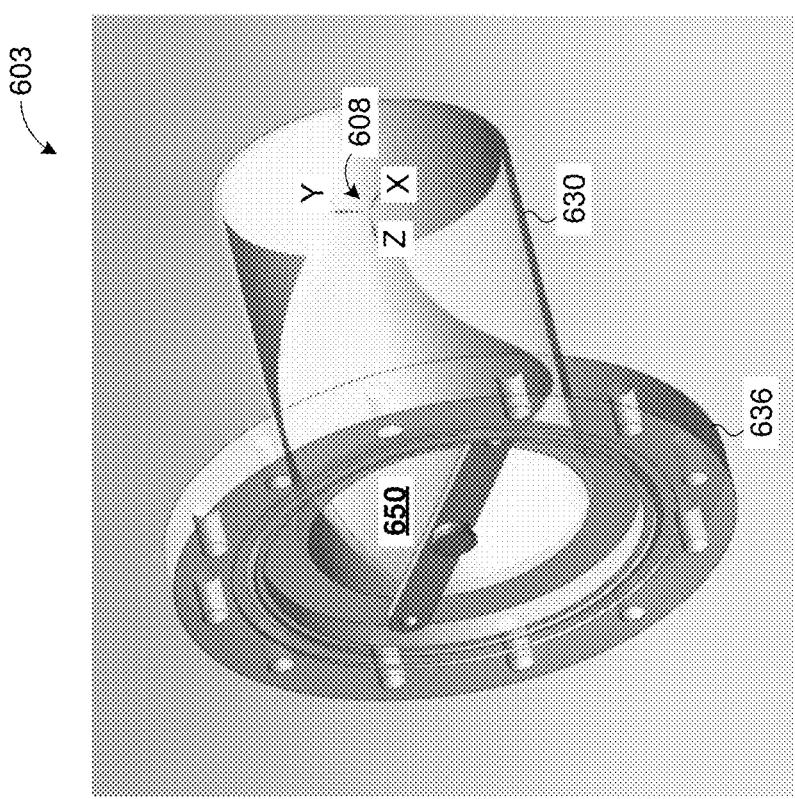

FIGS. 6C-6D are semi-transparent and cutaway views 603-604 of pump coupler 630 showing X-ray shield 650 (not in cutaway view, and filled with X-ray shielding material) positioned within pump coupler 630. Flange 636 can be considered a part of pump coupler 630.

The elongate twisted shape of shell 610 as illustrated can advantageously be used in or near a pump coupler (similar to X-ray shields 350, 450 of FIGS. 3-4). On one hand, the azimuthal sweep of the twisted shape about the Z axis of 608 blocks a high fraction of X-rays parallel to the Z axis and within the transverse extent of shell 610. On the other hand, the narrow transverse profile and gentle helical sweep of shell 610 provide low impedance to molecular flow through an associated pump coupler.

The illustrated shape of shell 610 is merely exemplary. In some examples, the azimuthal twist of shell 610 can be about 195° from flange 616 to base 614, or in a range 180° to 210°. In other examples, a variety of transverse profiles and azimuthal sweeps can be used. A shell having a cross-shaped transverse section (that is with four arms) can be fabricated with only about 100° of azimuthal twist, or in a range 90° to 110°. Alternatively, a shell can be fabricated with a single vane (e.g. extending from about port 622 to edge 627 relative to view 602) rotating approximately 390° about the Z-axis from flange to base. In further examples, the curved surfaces of shell 610 can be approximated by a set of planar surfaces.

Second Example Method

Figure 7:
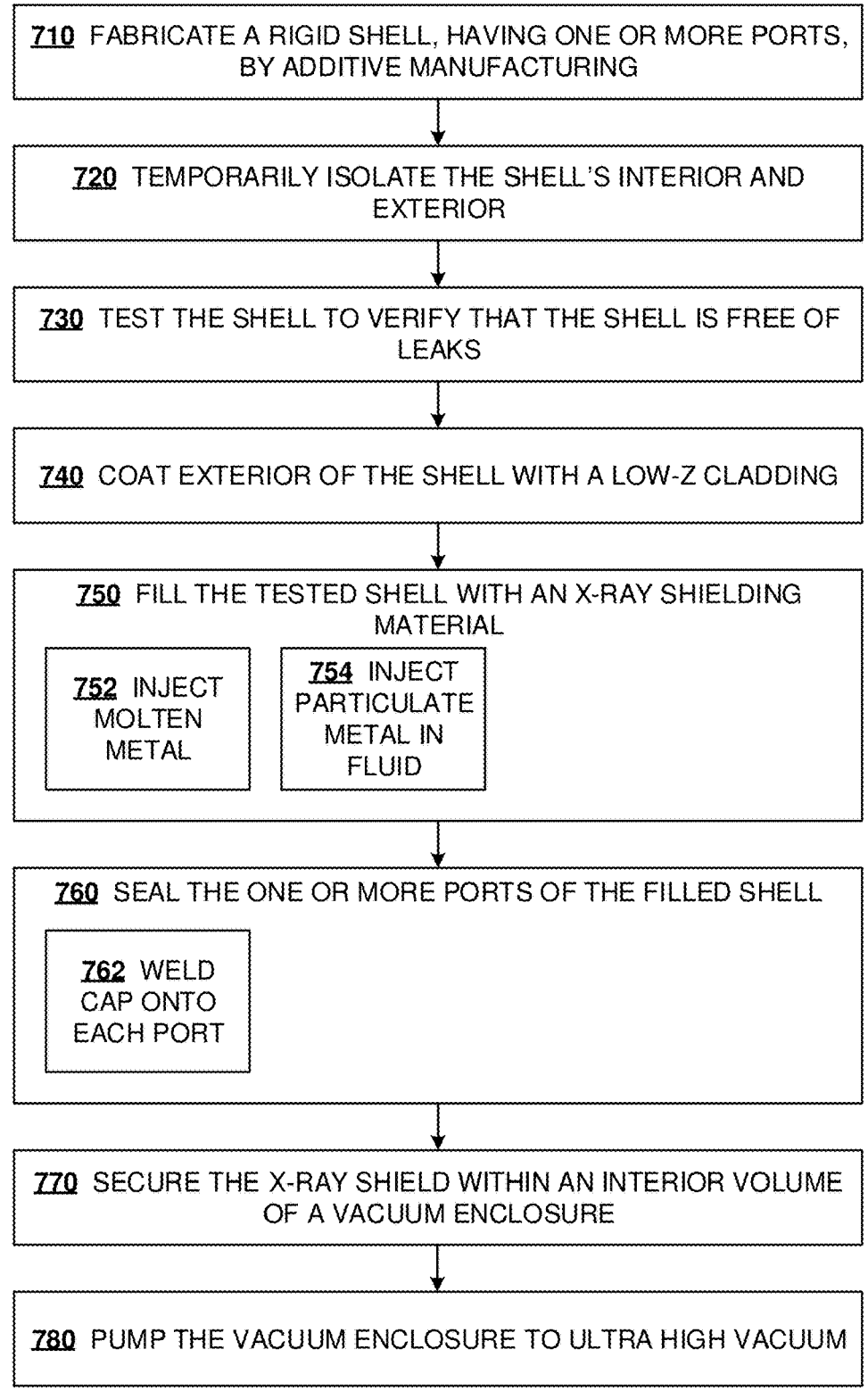
FIG. 7 is a flowchart of a second example method according to the disclosed technologies.

FIG. 7 is a flowchart 700 of a second example method according to the disclosed technologies. This method incorporates some of the variations or extension described for FIG. 5. At process block 710, a rigid shell can be fabricated by additive manufacturing. The shell can define a chamber and can have one or more ports. At process block 720, to facilitate leak testing at block 730, the shell's interior and exterior can be temporarily isolated from each other. Block 720 can be performed by capping ports shut or coupling ports to a He leak detector, in any combination. At block 730, the shell can be tested to verify that the shell is free of leaks to a predetermined leak rate threshold.

Once verified that the shell is free of leaks, at optional process block 740, a low-Z cladding can be applied to the exterior of the leak-tested (and leak-free) shell. At block 750, the tested shell can be filled with an X-ray shielding material. In some examples, block 750 can be performed using block 752, by injecting molten metal (e.g., molten lead or molten tin) into an interior chamber of the shell. In other examples, block 754 can be used to perform block 750. Particulate metal in a liquid can be injected into the interior chamber of the shell. In some examples, the particulate metal can be grains or powder of a metal such as lead or tungsten.

Once filled, the shell can be sealed at block 760. In some examples, block 762 can be used to perform block 760, by welding a cap onto each port of the filled shell. Other techniques can also be used. As another example, a shell port can be fabricated as a tube, and the tube can be crimped to close the port and then welded to seal the closed port. Fabrication of the X-ray shield can be complete after block 760.

At block 770, the fabricated X-ray shield can be secured within an interior volume of a vacuum enclosure. At block 780, the vacuum enclosure, with X-ray shield inside, can be pumped to an ultra-high vacuum. Thus, the X-ray shield having an ultra-high vacuum on its outside, and having a possibly vacuum-incompatible material (such as lead or a resin) on its inside, can be regarded as an inverse vacuum bottle as described herein.

In variations of this method, block 740 can be performed later, e.g. between process blocks 750 and 760, or between blocks 760 and 770.

Example Apparatus

Figure 8:
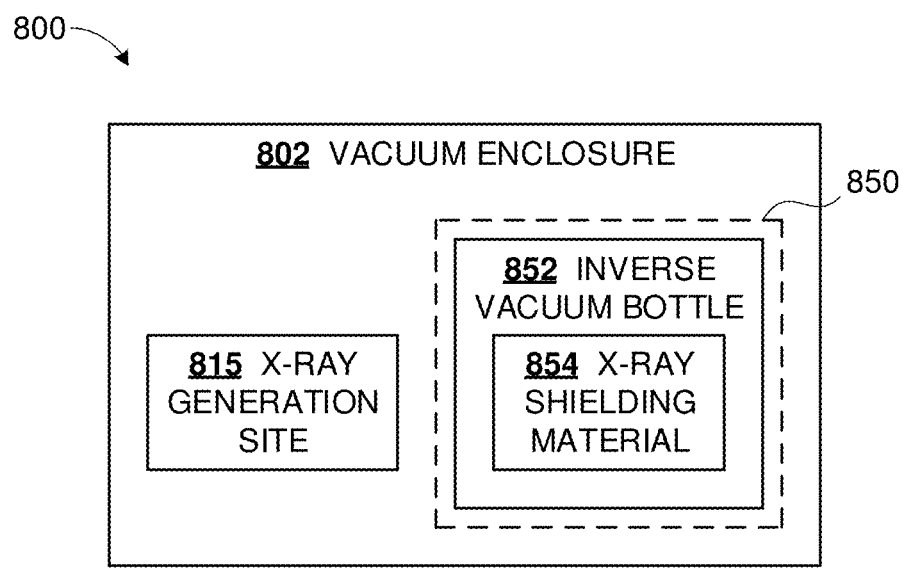
FIG. 8 is a block diagram of an apparatus incorporating an X-ray shield according to the disclosed technologies.

FIG. 8 is a block diagram of an apparatus 800 incorporating an X-ray shield. Apparatus 800 has a vacuum enclosure 802 in which an X-ray generation site 815 is present. X-ray shield 850 can also be situated within vacuum enclosure 802 and can include an inverse vacuum bottle 852 containing X-ray shielding material 854.

In some examples, apparatus 800 can be an electron microscope having a column axis. Apparatus 800 can include a pump coupler (similar to 130 of FIG. 1A). X-ray shield 850 can be positioned within the pump coupler, oriented to block at least 80% of X-rays that are emitted from X-ray generation site 820 through an intake aperture of pump coupler. In further examples, X-ray shield 830, positioned within the pump coupler, can reduce a vacuum conductance of the pump coupler by at most 20%. The pressure within vacuum enclosure 802 can be held below $10^{-9}$ mbar. X-ray shielding material 854 can be lead, or can include at least 50% by weight of lead. Inverse vacuum bottle 852 can incorporate stainless steel. In additional examples, inverse vacuum bottle 852 can be clad with a low-Z material having average atomic number less than or equal to 14. X-ray shield 850 can incorporate a twisted elongate member.

Third Example Method

FIG. 9 is a flowchart 900 of a third example method according to the disclosed technologies. At process block 910, an inverse vacuum bottle containing an X-ray shielding material can be placed inside vacuum enclosure of an electron microscope. Then, at process block 920, the vacuum enclosure can be pumped down to a pressure less than or equal to $10^{-9}$ mbar.

In some examples, the vacuum enclosure can include a pump coupler and, at block 910, the inverse vacuum bottle can be secured within the pump coupler.

Additional Example X-Ray Shields

Figure 10B:
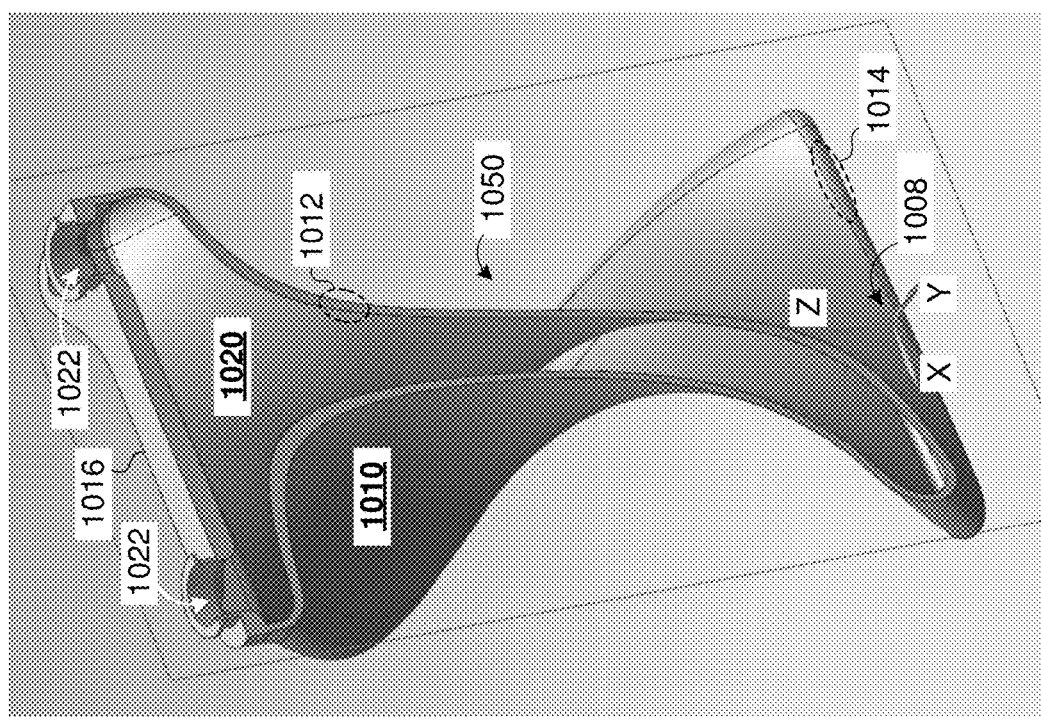
FIGS. 10A-10B are views of a second example X-ray shield according to the disclosed technologies.
Figure 10A:
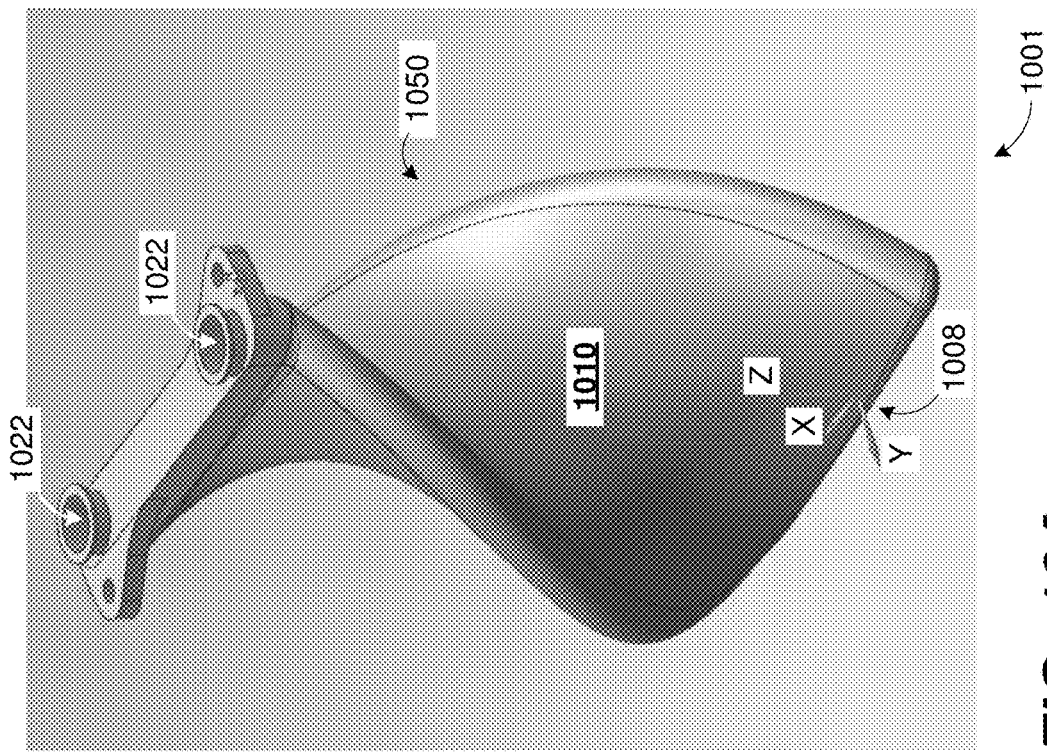

FIGS. 10A-10B are views 1001-1002 of a second example X-ray shield according to the disclosed technologies. In contrast to the example of FIGS. 6A-6D, the instant shield 1050 has two ports 1022. Both FIGS. 10A-10B show the shell 1010 (e.g., as fabricated at a process block similar to 510). Port caps and X-ray shielding material are omitted from FIGS. 10A-10B for clarity of illustration.

FIG. 10A is an oblique view of shield 1050. FIG. 10B is a cutaway view depicting wall 1012 and chamber 1020, arranged in an elongated twisted shape from base 1014 to flange 1016. The depicted shape is illustrative, and other shapes can be used. XYZ coordinate axes 1008 are also shown.

Figure 11:
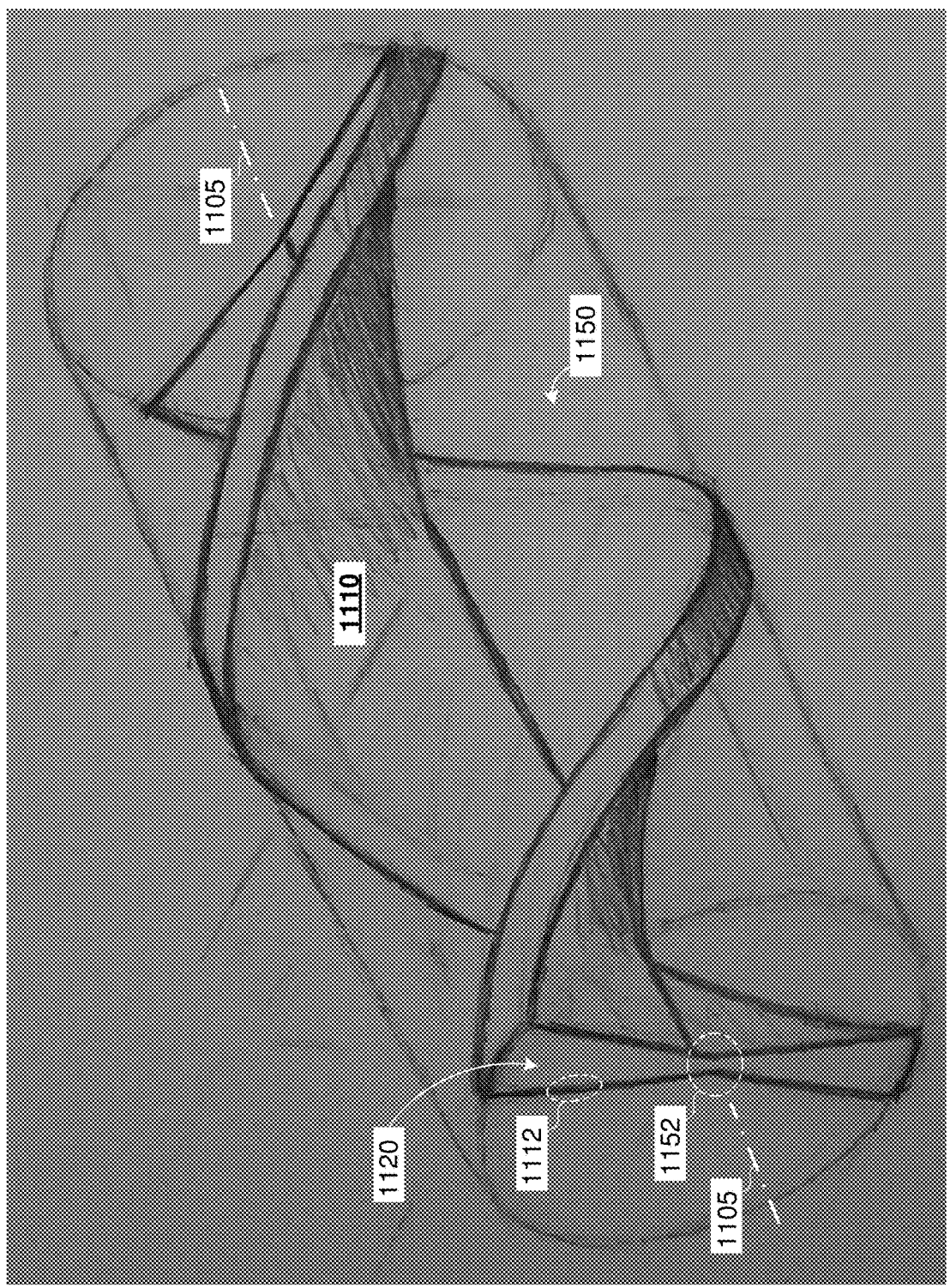
FIG. 11 is a view of a third example X-ray shield according to the disclosed technologies.

FIG. 11 is a concept view 1100 illustrating a shape of a third example X-ray shield 1150. Like other examples disclosed herein, shield 1150 has a shell 1110 enclosing a chamber 1120. Walls 1112 of shell 1110 are shown as solid lines. Endcaps, ports, flanges, or a filling shielding material are omitted from FIG. 11 for simplicity of illustration. Shield 1150 has a transverse cross-section which is thinner near longitudinal axis 1105 than away from axis 1105. Redistributing shielding material away from axis 1105 can improve shielding for X-rays that are away from or divergent from axis 1105, and can remove excess shielding material on-axis that provides only marginal benefit. Thus, the illustrated configuration can improve shielding effectiveness of a given mass of X-ray shielding material. Shield 1150 is illustrated having approximately 270° of azimuthal twist, but this is not a requirement and the illustrated concept can be applied to shields of other twists or other shapes.

Figure 12A:
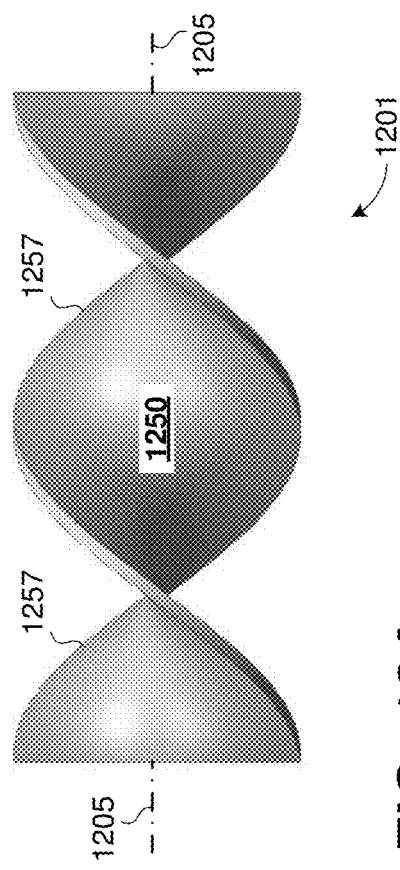
FIGS. 12A-12C are views of a fourth example X-ray shield according to the disclosed technologies.
Figure 12B:
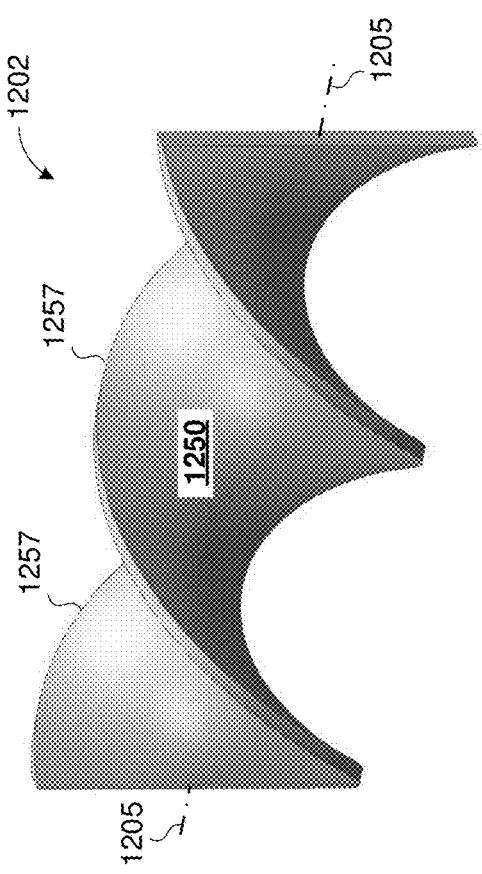
Figure 12C:
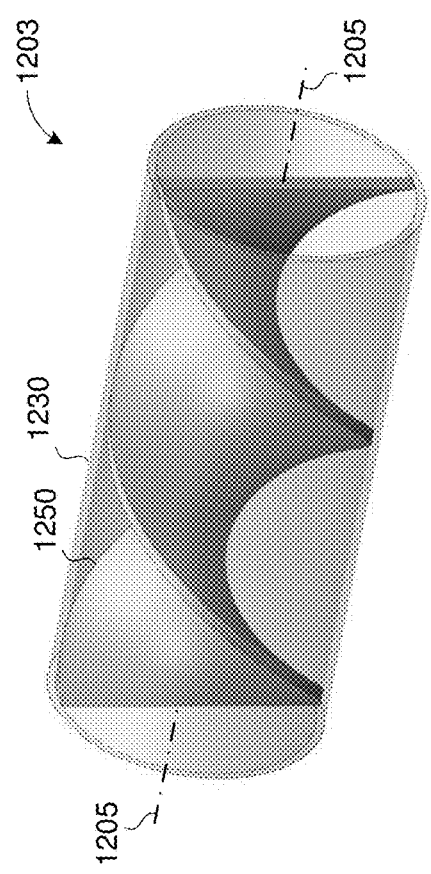

FIGS. 12A-12C are concept views 1201-1203 illustrating a shape of a fourth example X-ray shield 1250. Mechanical details such as a shell, a chamber, and ports are omitted from FIG. 12 for simplicity of illustration, and can be similar to other examples disclosed herein. FIG. 12A shows a profile view of shield 1250, which has about 360° of twist about longitudinal axis 1205. FIG. 12B shows an oblique view of shield 1250, while FIG. 12C shows shield 1250 fitted inside a cylindrical pipe 1230, which can be part of a pump coupler. The additional twist of shield 1250 relative to other disclosed examples can provide improved shielding, e.g. a greater percentage of X-rays blocked, particularly those having angles divergent from axis 1205, as compared to a shield with less twist.

Figure 13:
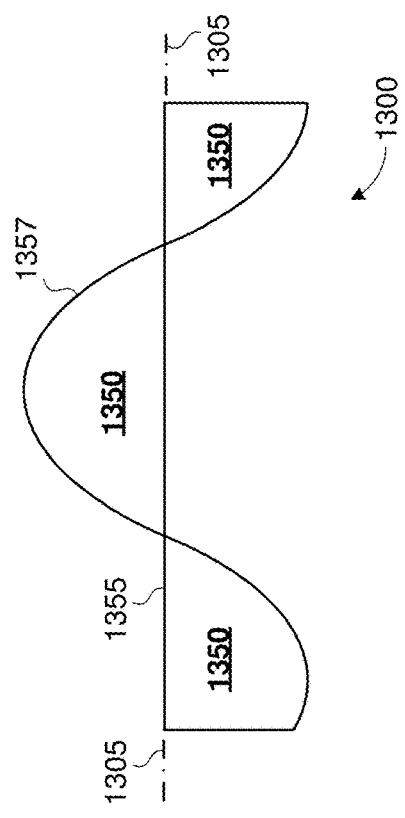
FIG. 13 is a view of a fifth example X-ray shield according to the disclosed technologies.

FIG. 13 is a concept view 1300 illustrating a shape of a fifth example X-ray shield 1350. Whereas the shape of shield 1250 has two intertwined helical edges 1257 about axis 1205, shield 1350 has one helical edge 1357 about axis 1305 and one straight edge 1355 generally collinear with axis 1305. Compared with shield 1250, shield 1350 can provide comparable shielding effectiveness for X-rays parallel to axis 1305 with lower vacuum impedance. Shield 1350 has a helical twist of approximately 390° about axis 1305.

Figure 14B:
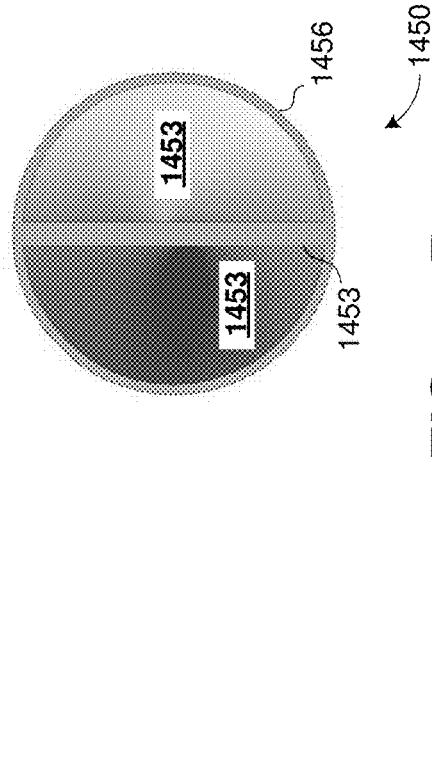
FIGS. 14A-14D are views of a sixth example X-ray shield according to the disclosed technologies.
Figure 14D:
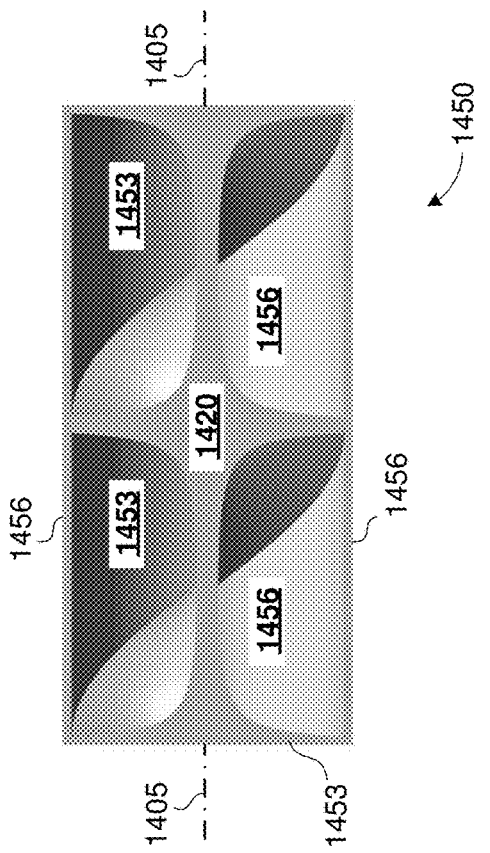
Figure 14A:
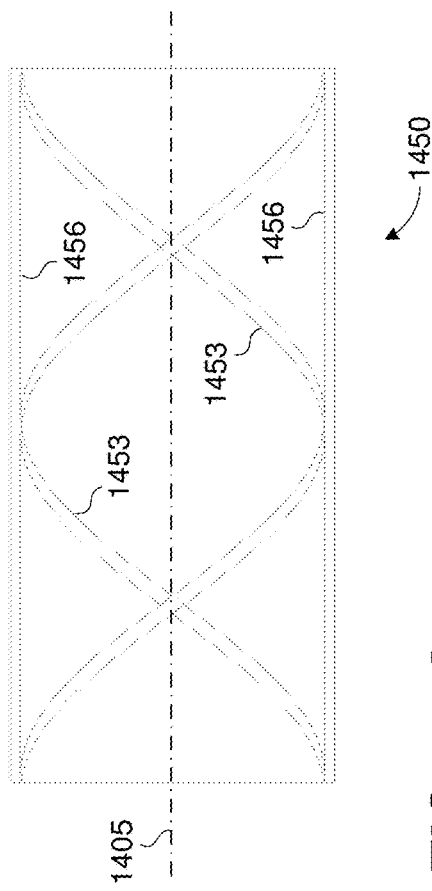
Figure 14C:
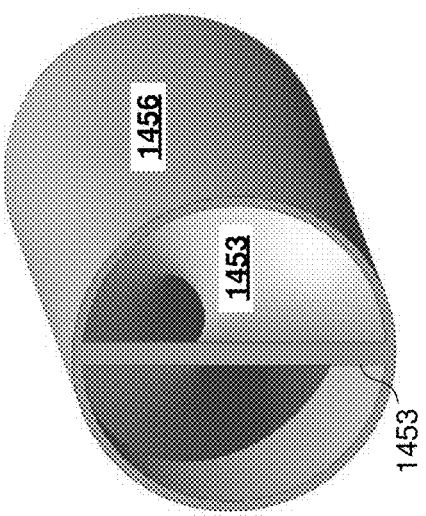

FIGS. 14A-14D are concept views 1401-1404 illustrating a shape of a sixth example X-ray shield 1450. Mechanical details such as a shell, a chamber, and ports are omitted from FIG. 14 for simplicity of illustration, and can be similar to other examples disclosed herein. FIG. 14A shows a profile sectional view of shield 1450 which has an elongated twist member 1453 and a sleeve member 1456. FIG. 14B shows an end view of shield 1450, while FIG. 14C shows an oblique view of shield 1450, and FIG. 14D shows a cutaway section of shield 1450. Like other disclosed examples, interior volume 1420 within twist member 1453 can be filled with X-ray shielding material. Twist member 1453 has about 360° of twist about longitudinal axis 1405, like shield 1250. In some examples, sleeve 1456 can be a double-wall pipe (e.g. an annular hollow shell) surrounding the same or a different chamber as inside twist member 1453. Such a configuration can advantageously improve shielding for X-rays emitted at angles divergent from axis 1405, in conjunction with a high level of shielding provided by twist member 1453 for X-rays parallel to axis 1405. In other examples, sleeve 1456 can be a single-wall pipe, which may not significantly increase X-ray shielding effectiveness of shield 1450, but which can improve mechanical rigidity or facilitate installation of shield 1450 within a pump coupler or other vacuum enclosure.

A Generalized Computer Environment

Figure 15:
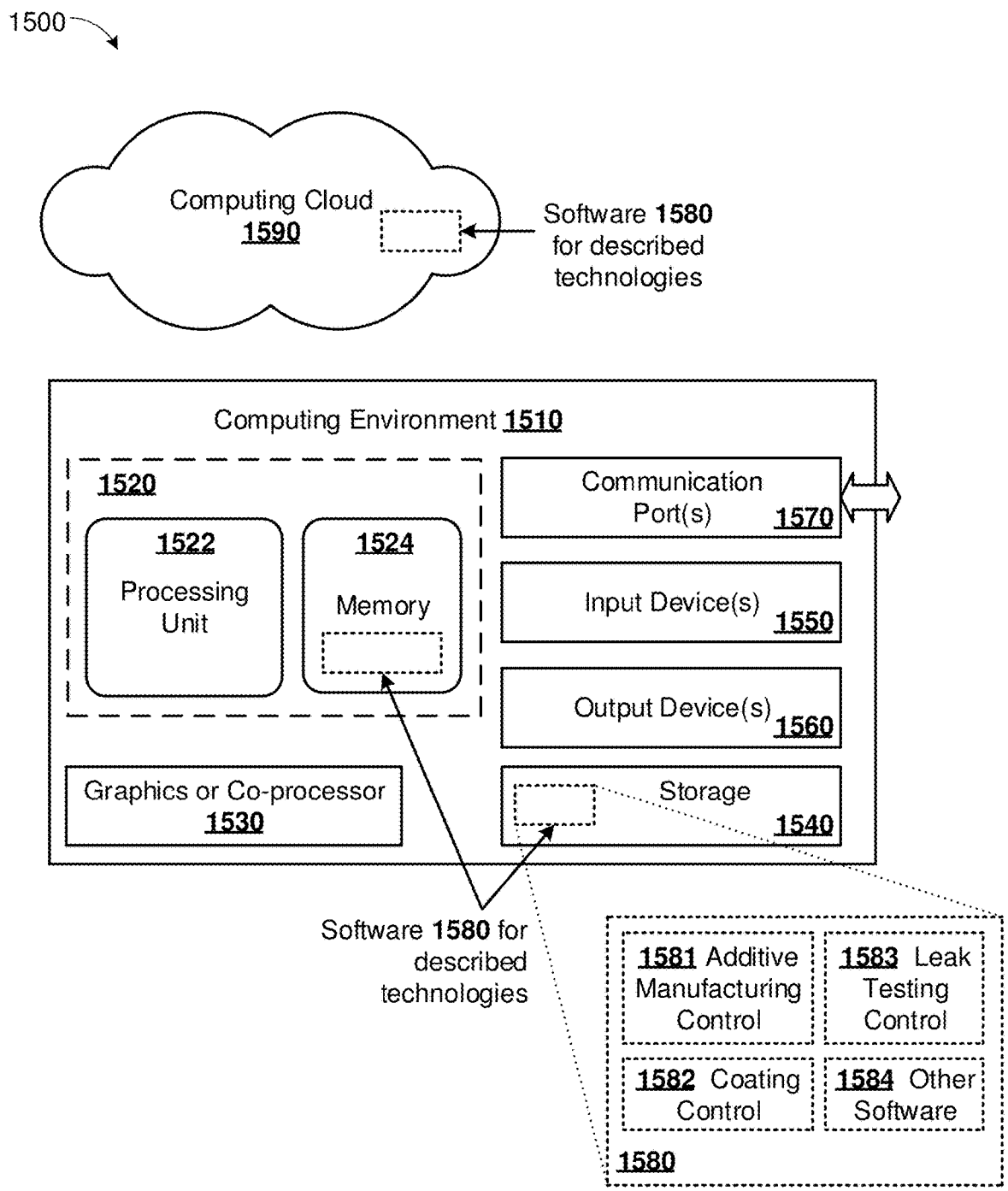
FIG. 15 illustrates a generalized example of a suitable computing environment in which described embodiments, techniques, and technologies pertaining to a disclosed non-linear optical device can be implemented.

FIG. 15 illustrates a generalized example of a suitable computing system 1500 in which described examples, techniques, and technologies for controlling manufacture of an X-ray shield can be implemented. The computing system 1500 is not intended to suggest any limitation as to scope of use or functionality of the present disclosure, as the innovations can be implemented in diverse general-purpose or special-purpose computing systems. The computing system 1500 can control an additive manufacturing process, another manufacturing process, a leak-testing process, a pumping process, or operation of an electron microscope, or associated instrumentation; or can acquire, process, output, or store measurement or operational data.

With reference to FIG. 15, computing environment 1510 includes one or more processing units 1522 and memory 1524. In FIG. 15, this basic configuration 1520 is included within a dashed line. Processing unit 1522 can execute computer-executable instructions, such as for control or data acquisition as described herein. Processing unit 1522 can be a general-purpose central processing unit (CPU), a processor in an application-specific integrated circuit (ASIC), or any other type of processor. In a multi-processing system, multiple processing units execute computer-executable instructions to increase processing power. Computing environment 1510 can also include a graphics processing unit or co-processing unit 1530. Tangible memory 1524 can be volatile memory (e.g., registers, cache, or RAM), non-volatile memory (e.g., ROM, EEPROM, or flash memory), or some combination thereof, accessible by processing units 1522, 1530. The memory 1524 stores software 1580 implementing one or more innovations described herein, in the form of computer-executable instructions suitable for execution by the processing unit(s) 1522, 1530. For example, software 1580 can include software 1581 for controlling an additive manufacturing process, software 1582 for controlling a coating process, software 1583 for controlling leak testing, or other software 1584. The inset shown for software 1580 in storage 1540 can be equally applicable to software 1580 elsewhere in FIG. 15. The memory 1524 can also store control parameters, calibration data, measurement data, or database data. The memory 1524 can also store configuration and operational data.

A computing system 1510 can have additional features, such as one or more of storage 1540, input devices 1550, output devices 1560, or communication ports 1570. An interconnection mechanism (not shown) such as a bus, controller, or network interconnects the components of the computing environment 1510. Typically, operating system software (not shown) provides an operating environment for other software executing in the computing environment 1510, and coordinates activities of the components of the computing environment 1510.

The tangible storage 1540 can be removable or non-removable, and includes magnetic disks, magnetic tapes or cassettes, CD-ROMs, DVDs, or any other medium which can be used to store information in a non-transitory way and which can be accessed within the computing environment 1510. The storage 1540 stores instructions of the software 1580 (including instructions and/or data) implementing one or more innovations described herein. Storage 1540 can also store image data, measurement data, reference data, calibration data, configuration data, or other databases or data structures described herein.

The input device(s) 1550 can be a mechanical, touch-sensing, or proximity-sensing input device such as a keyboard, mouse, pen, touchscreen, or trackball, a voice input device, a scanning device, or another device that provides input to the computing environment 1510. The output device(s) 1560 can be a display, printer, speaker, optical disk writer, or another device that provides output from the computing environment 1510. Input or output can also be communicated to/from a remote device over a network connection, via communication port(s) 1570.

The communication port(s) 1570 enable communication over a communication medium to another computing entity. The communication medium conveys information such as computer-executable instructions, audio or video input or output, or other data in a modulated data signal. A modulated data signal is a signal that has one or more of its characteristics set or changed in such a manner as to encode information in the signal. By way of example, and not limitation, communication media can use an electrical, optical, RF, acoustic, or other carrier.

A data acquisition system can be integrated into computing environment 1510, either as an input device 1550 or coupled to a communication port 1570, and can include analog-to-digital converters or connections to an instrumentation bus. An instrumentation control system can be integrated into computing environment 1510, either as an output device 1560 or coupled to a communication port 1570, and can include digital-to-analog converters, switches, or connections to an instrumentation bus.

In some examples, computer system 1500 can also include a computing cloud 1590 in which instructions implementing all or a portion of the disclosed technology are executed. Any combination of memory 1524, storage 1540, and computing cloud 1590 can be used to store software instructions and data of the disclosed technologies.

The present innovations can be described in the general context of computer-executable instructions, such as those included in program modules, being executed in a computing system on a target real or virtual processor. Generally, program modules or components include routines, programs, libraries, objects, classes, components, data structures, etc. that perform particular tasks or implement particular data types. The functionality of the program modules can be combined or split between program modules as desired in various embodiments. Computer-executable instructions for program modules can be executed within a local or distributed computing system.

The terms "computing system," "computing environment," and "computing device" are used interchangeably herein. Unless the context clearly indicates otherwise, neither term implies any limitation on a type of computing system, computing environment, or computing device. In general, a computing system, computing environment, or computing device can be local or distributed, and can include any combination of special-purpose hardware and/or general-purpose hardware and/or virtualized hardware, together with software implementing the functionality described herein.

General Considerations

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items. Furthermore, as used herein, the terms "or" and "and/or" mean any one item or combination of items in the phrase.

The systems, methods, and apparatus described herein should not be construed as limiting in any way. Instead, the present disclosure is directed toward all novel and non-obvious features and aspects of the various disclosed embodiments, alone and in various combinations and subcombinations with one another. The disclosed systems, methods, and apparatus are not limited to any specific aspect or feature or combinations thereof, nor do the disclosed systems, methods, and apparatus require that any one or more specific advantages be present or problems be solved. The technologies from any example can be combined with the technologies described in any one or more of the other examples. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce," "provide," or "test" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus are referred to as "lowest", "best", "minimum," or the like. It will be appreciated that such descriptions are intended to indicate that a selection among a few or among many alternatives can be made, and such selections need not be lower, better, less, or otherwise preferable to other alternatives not considered.

Theories of operation, scientific principles, or other theoretical descriptions presented herein in reference to the apparatus or methods of this disclosure have been provided for the purposes of better understanding and are not intended to be limiting in scope. The apparatus and methods in the appended claims are not limited to those apparatus and methods that function in the manner described by such theories of operation.

Any of the disclosed methods can be controlled by, or implemented as, computer-executable instructions or a computer program product stored on one or more computer-readable storage media, such as tangible, non-transitory computer-readable storage media, and executed on a computing device (e.g., any available computing device, including tablets, smart phones, or other mobile devices that include computing hardware). Tangible computer-readable storage media are any available tangible media that can be accessed within a computing environment (e.g., one or more optical media discs such as DVD or CD, volatile memory components (such as DRAM or SRAM), or nonvolatile memory components (such as flash memory or hard drives)). By way of example, and with reference to FIG. 15, computer-readable storage media include memory 1524, and storage 1540. The terms computer-readable storage media or computer-readable media do not include signals and carrier waves. In addition, the terms computer-readable storage media or computer-readable media do not include communication ports (e.g., 1570).

Any of the computer-executable instructions for implementing the disclosed techniques as well as any data created and used during implementation of the disclosed embodiments can be stored on one or more computer-readable storage media. The computer-executable instructions can be part of, for example, a dedicated software application or a software application that is accessed or downloaded via a web browser or other software application (such as a remote computing application). Such software can be executed, for example, on a single local computer (e.g., any suitable commercially available computer) or in a network environment (e.g., via the Internet, a wide-area network, a local-area network, a client-server network, a cloud computing network, or other such network) using one or more network computers.

For clarity, only certain selected aspects of the software-based implementations are described. Other details that are well known in the art are omitted. For example, it should be understood that the disclosed technology is not limited to any specific computer language or program. For instance, the disclosed technology can be implemented by software written in Adobe Flash, C, C++, C#, Curl, Dart, Fortran, Java, JavaScript, Julia, Lisp, Matlab, Octave, Perl, Python, Qt, R, Ruby, SAS, SPSS, SQL, WebAssembly, any derivatives thereof, or any other suitable programming language, or, in some examples, markup languages such as HTML or XML, or with any combination of suitable languages, libraries, and packages. Likewise, the disclosed technology is not limited to any particular computer or type of hardware. Certain details of suitable computers and hardware are well known and need not be set forth in detail in this disclosure.

Furthermore, any of the software-based embodiments (comprising, for example, computer-executable instructions for causing a computer to perform any of the disclosed methods) can be uploaded, downloaded, side-loaded, or remotely accessed through a suitable communication means. Such suitable communication means include, for example, the Internet, the World Wide Web, an intranet, software applications, cable (including fiber optic cable), magnetic communications, electromagnetic communications (including RF, microwave, infrared, and optical communications), electronic communications, or other such communication means.

In view of the many possible embodiments to which the principles of the disclosed subject matter may be applied, it should be recognized that the illustrated embodiments are only preferred examples of the disclosed subject matter and should not be taken as limiting the scope of the claims. Rather, the scope of the claimed subject matter is defined by the following claims. We therefore claim all that comes within the scope and spirit of these claims.

We claim:

1. A method of manufacturing an X-ray shield, comprising:
    fabricating a shell defining a chamber and having one or more ports, wherein the shell comprises an elongate member having a twist about an axis, and a transverse cross-section of the elongate member is thinner near the axis than away from the axis;
    testing the shell to verify that the shell is free of leaks;
    filling the tested shell with an X-ray shielding material; and
    sealing the one or more ports of the filled shell.

2. The method of claim 1, wherein the shell is fabricated by an additive manufacturing process.

3. The method of claim 2, wherein the additive manufacturing process comprises direct metal laser sintering (DMLS), selective laser melting (SLM), electron beam melting (EBM), or binder jetting (BJ).

4. The method of claim 1, further comprising:
    temporarily isolating the chamber from an environment surrounding the shell for a duration encompassing the testing.

5. The method of claim 1, wherein the testing has a leak rate threshold less than or equal to $10^{-7}$ mbar·l/s.

6. The method of claim 1, wherein the shell is rigid.

7. The method of claim 1, wherein the shell comprises stainless steel.

8. The method of claim 1, wherein the shell has a median wall thickness in a range 0.1 to 1.0 mm.

9. The method of claim 1, wherein the X-ray shielding material comprises a metal and the filling operation comprises introducing the metal in a molten state into the chamber.

10. The method of claim 1, wherein the X-ray shielding material comprises a resin loaded with metal particles.

11. The method of claim 1, wherein the one or more ports comprise a first port used to introduce the X-ray shielding material into the chamber during the filling operation and a second port used to release displaced fluid from the chamber during the filling operation.

12. The method of claim 1, wherein the sealing comprises welding a respective cap onto each of the one or more ports.

13. The method of claim 1, wherein the rigid shell comprises a material having a first average atomic number Z1, and the method further comprises:
cladding the rigid shell with another material having an average atomic number Z2 less than Z1.

14. A method of reducing X-ray emission from an electron microscope housed in a vacuum enclosure, the method comprising:
manufacturing an X-ray shield by the method of claim 1; and
securing the X-ray shield within an interior volume of the vacuum enclosure.

15. The method of claim 14, wherein the X-ray shield is secured within a pump coupler of the electron microscope, and oriented so as to block at least 80% of X-rays emitted through an intake aperture of the pump coupler and parallel to a longitudinal axis of the pump coupler.

16. An apparatus comprising:
a vacuum enclosure; and
an X-ray shield positioned within the vacuum enclosure and comprising:
an inverse vacuum bottle containing an X-ray shielding material, and comprising:
an elongate member having a twist about an axis, wherein a transverse cross-section of the elongate member is thinner near the axis than away from the axis.

17. The apparatus of claim 16, wherein the apparatus is an electron microscope having a column axis, and the apparatus further comprises:
a pump coupler, wherein the X-ray shield is positioned within the pump coupler and oriented so as to block at least 80% of X-rays that are emitted from an X-ray generation site within the vacuum enclosure and through an intake aperture of the pump coupler.

18. The apparatus of claim 17, wherein a vacuum conductance of the pump coupler is reduced due to the X-ray shield, compared to without the X-ray shield, by at most 20%.

19. The apparatus of claim 16, wherein a pressure within the vacuum vessel is below $10^{-9}$ mbar.

20. The apparatus of claim 16, wherein the X-ray shielding material comprises at least 50% by weight of lead.

21. The apparatus of claim 16, wherein the inverse vacuum bottle comprises stainless steel.

22. The apparatus of claim 21, wherein the stainless steel is clad with a material having an average atomic number less than or equal to 14.

23. The apparatus of claim 16, wherein the twist is in a range 90° to 390°.

24. A method comprising:
placing an inverse vacuum bottle containing an X-ray shielding material inside a vacuum enclosure of an electron microscope, wherein the inverse vacuum bottle comprises an elongate member having a twist about an axis, and a transverse cross-section of the elongate member is thinner near the axis than away from the axis; and
pumping the vacuum enclosure to a pressure below $10^{-9}$ mbar.

25. The method of claim 24, wherein the vacuum vessel comprises a pump coupler, and the placing comprises securing the inverse vacuum bottle within the pump coupler.

* * * * *